United States Patent
Wiley

(10) Patent No.: US 10,219,415 B2
(45) Date of Patent: Feb. 26, 2019

(54) SERVER FACILITY COOLING SYSTEM

(71) Applicant: Facebook, Inc., Menlo Park, CA (US)

(72) Inventor: Scott C. Wiley, Los Altos, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 15/431,748

(22) Filed: Feb. 13, 2017

(65) Prior Publication Data
US 2018/0235107 A1    Aug. 16, 2018

(51) Int. Cl.
*H05K 7/20* (2006.01)

(52) U.S. Cl.
CPC ....... *H05K 7/20781* (2013.01); *H05K 7/2079* (2013.01); *H05K 7/20236* (2013.01)

(58) Field of Classification Search
CPC ................ H05K 7/20781; H05K 7/20754
See application file for complete search history.

(56) References Cited

U.S. PATENT DOCUMENTS

| | | | | |
|---|---|---|---|---|
| 3,965,972 A * | 6/1976 | Petersen | F24F 5/0046 165/45 |
| 4,936,110 A * | 6/1990 | Kuckens | F24D 11/0214 62/260 |
| 5,244,037 A * | 9/1993 | Warnke | F24D 3/18 165/104.31 |
| 5,261,251 A * | 11/1993 | Galiyano | F24F 5/0046 62/176.6 |
| 5,339,890 A * | 8/1994 | Rawlings | F25B 30/06 165/45 |
| 5,533,355 A * | 7/1996 | Rawlings | E21B 17/18 62/260 |
| 5,533,356 A * | 7/1996 | DeMasters | E21B 23/01 62/260 |
| 5,590,715 A * | 1/1997 | Amerman | E21B 23/00 166/290 |
| 6,450,247 B1* | 9/2002 | Raff | F24F 5/0046 165/45 |
| 8,109,110 B2* | 2/2012 | Wiggs | F25B 30/06 62/260 |
| 9,284,952 B2* | 3/2016 | Peele | F24T 10/10 |
| 9,599,377 B2* | 3/2017 | Kato | F25B 13/00 |
| 9,811,126 B2* | 11/2017 | Chainer | H05K 7/20654 |
| 2007/0023163 A1* | 2/2007 | Kidwell | F25B 30/06 165/45 |
| 2009/0262495 A1* | 10/2009 | Neudorfer | G06F 1/20 361/679.47 |
| 2009/0281668 A1* | 11/2009 | Nesler | B09C 1/02 700/276 |

(Continued)

*Primary Examiner* — James Wu
*Assistant Examiner* — Michael A Matey
(74) *Attorney, Agent, or Firm* — FisherBroyles, LLP

(57) ABSTRACT

Technology is provided for a server facility cooling system. The system can include a coolant tank containing an electrically insulating liquid and one or more servers submerged in the liquid. At least a portion of the heat generated by the servers is transferred to the liquid. An elongate cooling loop extends vertically between a first end and a second end, wherein the first end is located in the air and the second end is located underground. A heat exchanger is positioned between the coolant tank and the cooling loop to transfer heat from the liquid to the cooling loop. A cylindrical cooling tower is positioned around the first end of the cooling loop.

10 Claims, 1 Drawing Sheet

(56) References Cited

U.S. PATENT DOCUMENTS

| | | | |
|---|---|---|---|
| 2011/0042057 A1* | 2/2011 | Li | F24F 5/0046 165/253 |
| 2011/0239683 A1* | 10/2011 | Czamara | H05K 7/20745 62/259.4 |
| 2013/0014926 A1* | 1/2013 | Iyengar | F28D 15/00 165/200 |
| 2014/0262136 A1* | 9/2014 | Jensen | F24T 10/15 165/45 |
| 2014/0307384 A1* | 10/2014 | Best | H05K 7/20781 361/679.53 |
| 2014/0362527 A1* | 12/2014 | Best | G06F 1/20 361/679.53 |
| 2015/0195953 A1* | 7/2015 | Best | H05K 7/20763 165/11.1 |
| 2017/0265328 A1* | 9/2017 | Sasaki | H05K 7/20236 |

\* cited by examiner

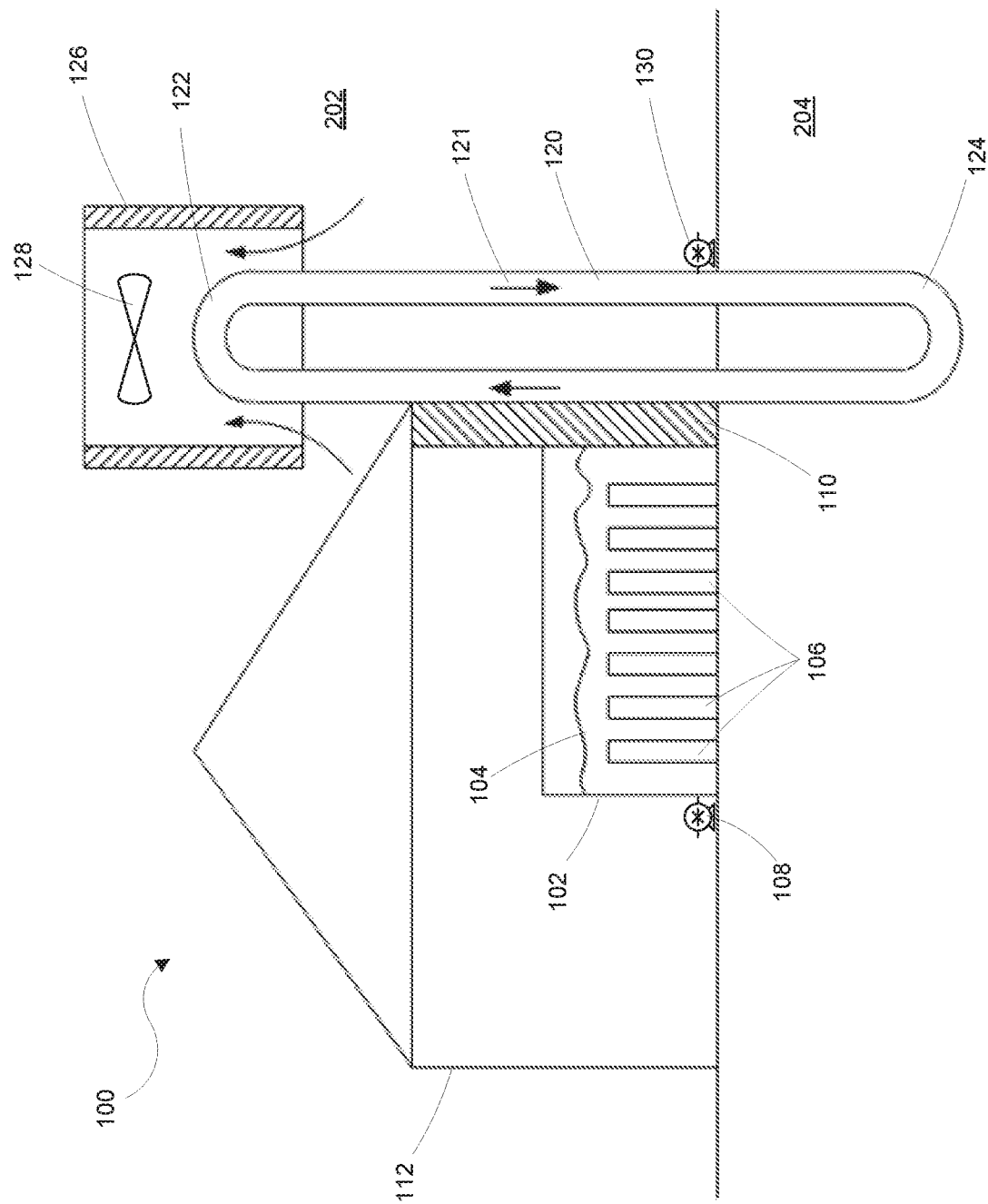

SERVER FACILITY COOLING SYSTEM

TECHNICAL FIELD

This patent application is directed to computer cooling systems and, more specifically, to server facility cooling systems.

BACKGROUND

Cooling a computer component (e.g., microprocessor) can enhance the lifetime, efficiency, and/or performance of the component. Conventional server facilities move air through server racks from a cold aisle to a hot aisle to cool the servers and the components within them. The hot aisle is typically cooled with an air conditioner system. The fans used to move the air and the air conditioning systems can consume a great deal of energy and therefore account for a large portion of the cost of operating a server facility.

BRIEF DESCRIPTION OF THE DRAWINGS

Embodiments of the server cooling systems described herein may be better understood by referring to the following Detailed Description in conjunction with the accompanying drawings, in which like reference numerals indicate identical or functionally similar elements:

FIG. 1 is a schematic representation of a server cooling system according to a representative embodiment.

The headings provided herein are for convenience only and do not necessarily affect the scope or meaning of the claimed embodiments. Further, the drawings have not necessarily been drawn to scale. For example, the dimensions of some of the elements in the figures may be expanded or reduced to help improve the understanding of the embodiments. Moreover, while the disclosed technology is amenable to various modifications and alternative forms, specific embodiments have been shown by way of example in the drawings and are described in detail below. The intention, however, is not to unnecessarily limit the embodiments described. On the contrary, the embodiments are intended to cover all suitable modifications, equivalents, and alternatives falling within the scope of the embodiments as defined by the appended claims.

DETAILED DESCRIPTION

Overview

Technology is provided for server facility cooling systems. In a representative embodiment, the system can include a tank containing an electrically insulating liquid and one or more servers submerged in the liquid. Liquids allow the transfer of more heat from computer components being cooled than air, making a liquid cooling system desirable for high performance computer applications and for extending the life of electronic components. At least a portion of the heat generated by the servers is transferred to the liquid. An elongate cooling loop extends vertically between a first end and a second end, wherein the first end is located in the surrounding air and the second end is located underground. A heat exchanger is positioned between the coolant tank and the cooling loop to transfer heat from the liquid to the cooling loop. The cooling loop can contain a coolant, such as water, circulating in the loop between the air cooled portion (i.e., first end) and the ground cooled portion (i.e., second end). In some embodiments, a cylindrical cooling tower is positioned around the first end of the cooling loop to enhance the air cooling of the first end of the cooling loop. In some embodiments, the coolant passively circulates in the cooling loop by convection. In other embodiments, the coolant can be circulated with a pump, for example.

General Description

Various examples of the devices introduced above will now be described in further detail. The following description provides specific details for a thorough understanding and enabling description of these examples. One skilled in the relevant art will understand, however, that the techniques discussed herein may be practiced without many of these details. Likewise, one skilled in the relevant art will also understand that the technology can include many other features not described in detail herein. Additionally, some well-known structures or functions may not be shown or described in detail below so as to avoid unnecessarily obscuring the relevant description.

The terminology used below is to be interpreted in its broadest reasonable manner, even though it is being used in conjunction with a detailed description of some specific examples of the embodiments. Indeed, some terms may even be emphasized below; however, any terminology intended to be interpreted in any restricted manner will be overtly and specifically defined as such in this section.

FIG. 1 illustrates a server facility cooling system 100 according to a representative embodiment. The cooling system 100 includes a tank 102 containing an electrically insulating liquid 104 and one or more servers 106 submerged in the liquid 104. Suitable electrically insulating liquids include, for example and without limitation, 3M Novec® and Flourinert®. Because the liquid 104 is electrically insulating it does not interfere with the operation of the servers 106, yet at least a portion of the heat generated by the servers 106 is transferred to the liquid 104. The liquid 104 can be allowed to passively circulate by convection through and around the servers 106 or the liquid can be stirred or pumped within the tank 102 with a suitable device, such as a pump 108.

At least one wall of the coolant tank 102 comprises a heat exchanger, such as a heat conductive wall 110. The heat conductive wall 110 is in contact with the liquid 104 such that it conducts heat from the liquid 104. The heat conductive wall 110 can comprise a heat conductive material such as copper, aluminum, steel, concrete, or the like. In some embodiments, the coolant tank 102 can be located within a building 112 and the heat conductive wall 110 can comprise an outer wall of the building.

In some embodiments, a cooling loop 120 is operatively coupled to the heat conductive wall 110 in order to cool the wall. For example, the cooling loop 120 can be positioned in contact with the heat conductive wall 110. In other embodiments, a portion of the cooling loop 120 can extend through the heat conductive wall 110. In some embodiments, a radiator type heat exchanger can be used. The cooling loop 120 can extend vertically between a first end portion 122 and a second end portion 124, wherein the first end portion 122 is located in the surrounding air 202 and the second end portion 124 is located underground 204. The cooling loop 120 can contain a coolant 121, such as water, that circulates in the loop between the air cooled portion (i.e., first end portion 122) and the ground cooled portion (i.e., second end portion 124). In some embodiments, the coolant 121 passively circulates in the cooling loop 120 by convection. In other embodiments, circulation of the coolant 121 can be assisted with a pump 130, for example. The coolant 121 is represented in the figures with arrows indicating the direction of flow. In the depicted embodiment, as the heat conductive wall 110 warms the water in the cooling loop 120, the water rises causing the water to flow in a clockwise direction. As the water reaches the first end portion 122, air cools the water, thereby reinforcing the clockwise convective flow. The water is further cooled in the second end portion 124 by the ground 204.

In some embodiments, a cylindrical cooling tower 126 is positioned around the first end portion 122 of the cooling loop 120 to enhance the air cooling of the first end portion 122 of the cooling loop 120. In some embodiments, the cooling tower 126 allows air warmed by the first end portion 122 to rise, causing a passive air flow up through the cooling tower 126 as indicated with arrows. In some embodiments, a fan 128 can be positioned in the cooling tower 126 to help move air through the cooling tower 126. In other embodiments, the cooling tower 126 can be configured as a vortex engine to entrain additional airflow through the cooling tower 126.

In at least one embodiment, the server facility cooling system can be completely passive. In other words, the liquid 104 and the coolant 121 are circulated by convection without the use of pumps or fans. Accordingly, the servers 106 can be cooled without expending additional energy resources. In some embodiments, circulation of the liquid 104 and/or the coolant 121 can be minimally assisted with pumps or fans; however, most of the circulation is convective, thereby minimizing energy expenditures required to cool the servers 106.

Methods for cooling servers are disclosed herein. In one embodiment, a method for cooling servers can include submerging one or more servers in an electrically insulating liquid, whereby at least a portion of the heat generated by the one or more servers is transferred to the liquid. A heat exchanger is positioned in contact with the electrically insulating liquid and a coolant is circulated between the heat exchanger and at least one heat sink. In some embodiments, the at least one heat sink can include the Earth and/or surrounding atmosphere (i.e., air).

Remarks

The above description and drawings are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments. Accordingly, the embodiments are not limited except as by the appended claims.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. It will be appreciated that the same thing can be said in more than one way. Consequently, alternative language and synonyms may be used for any one or more of the terms discussed herein, and any special significance is not to be placed upon whether or not a term is elaborated or discussed herein. Synonyms for some terms are provided. A recital of one or more synonyms does not exclude the use of other synonyms. The use of examples anywhere in this specification, including examples of any term discussed herein, is illustrative only and is not intended to further limit the scope and meaning of the disclosure or of any exemplified term. Likewise, the disclosure is not limited to various embodiments given in this specification. Unless otherwise defined, all technical and scientific terms used herein have the same meaning as commonly understood by one of ordinary skill in the art to which this disclosure pertains. In the case of conflict, the present document, including definitions, will control.

What is claimed is:

1. A server cooling system, comprising:
    a tank containing an electrically insulating liquid;
    one or more servers submerged in the liquid, wherein at least a portion of the heat generated by the one or more servers is transferred to the liquid;
    an elongated cooling loop extending vertically between a first end portion and a second end portion, wherein the first end portion is located in the surrounding air and the second end portion is located beneath the surface of the earth; and
    a heat exchanger positioned between the tank and the cooling loop configured to transfer heat from the liquid to the cooling loop,
    wherein the heat exchanger comprises a thermally conductive wall in contact with the liquid on one side and in contact with the cooling loop on an opposite side.

2. The cooling system of claim 1, further comprising a cylindrical cooling tower positioned around the first end portion of the cooling loop.

3. The cooling system of claim 2, further comprising a fan positioned in the cooling tower to move air through the cooling tower.

4. The cooling system of claim 1, wherein the thermally conductive wall comprises metal.

5. The cooling system of claim 1, wherein the cooling loop comprises a tubular loop containing water.

6. The cooling system of claim 5, further comprising a pump coupled to the cooling loop to circulate the water in the tubular loop.

7. A server cooling system, comprising:
    a coolant tank containing an electrically insulating liquid;
    one or more servers submerged in the liquid, wherein at least a portion of the heat generated by the one or more servers is transferred to the liquid;
    an elongated cooling loop extending vertically between a first end portion and a second end portion, wherein the first end portion is located in the surrounding air and the second end portion is located beneath the surface of the earth;
    a heat exchanger positioned between the coolant tank and the cooling loop configured to transfer heat from the liquid to the cooling loop; and
    a cylindrical cooling tower positioned around the first end portion of the cooling loop,
    wherein the heat exchanger comprises a metal wall in contact with the liquid on one side and in contact with the elongated cooling loop on an opposite side.

8. The cooling system of claim 7, wherein the cooling loop comprises a tubular loop containing water.

9. A method for cooling servers, comprising:
- submerging one or more servers in an electrically insulating liquid, whereby at least a portion of the heat generated by the one or more servers is transferred to the liquid;
- positioning a heat exchanger in contact with the electrically insulating liquid; and
- circulating a coolant in a vertically oriented loop between the heat exchanger and at least one heat sink, wherein the at least one heat sink is the earth,
- wherein the heat exchanger comprises a thermally conductive wall in contact with the electrically insulating liquid on one side and in contact with the vertically oriented loop on an opposite side.

10. The method of claim 9, further comprising circulating the electrically insulating liquid around the one or more servers.

\* \* \* \* \*